US008115385B2

(12) United States Patent
Norfidathul et al.

(10) Patent No.: US 8,115,385 B2
(45) Date of Patent: Feb. 14, 2012

(54) MULTI-CHIP PACKAGED LED LIGHT SOURCE

(75) Inventors: Aizar Abdul Karim Norfidathul, Penang (MY); Chiau Jin Lee, Penang (MY); Kheng Leng Tan, Penang (MY); Keat Chuan Ng, Penang (MY); Kiam Soon Ong, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 12/871,704

(22) Filed: Aug. 30, 2010

(65) Prior Publication Data

US 2010/0320485 A1    Dec. 23, 2010

Related U.S. Application Data

(63) Continuation of application No. 11/622,753, filed on Jan. 12, 2007, now Pat. No. 7,800,304.

(51) Int. Cl.
*H01J 1/62* (2006.01)
(52) U.S. Cl. ... 313/512; 362/612; 362/246; 362/249.02; 362/311.02; 257/99; 257/100
(58) Field of Classification Search .................. None
See application file for complete search history.

(56) References Cited

U.S. PATENT DOCUMENTS

| 6,498,440 | B2 | 12/2002 | Stam |
| 7,247,940 | B2 | 7/2007 | Hofer et al. |
| 7,327,078 | B2 * | 2/2008 | Setlur et al. ................... 313/499 |
| 7,365,407 | B2 | 4/2008 | Ng |
| 2002/0163001 | A1 | 11/2002 | Shaddock |
| 2004/0051171 | A1 | 3/2004 | Ng et al. |
| 2004/0070338 | A1 * | 4/2004 | Noguchi et al. ............... 313/512 |
| 2004/0090180 | A1 * | 5/2004 | Shimizu et al. ............... 313/512 |
| 2006/0180925 | A1 | 8/2006 | Lee et al. |
| 2006/0226435 | A1 | 10/2006 | Mok et al. |
| 2006/0255713 | A1 * | 11/2006 | Kondo et al. ................. 313/486 |
| 2008/0258171 | A1 | 10/2008 | Tsukagoshi |
| 2009/0078958 | A1 | 3/2009 | Wu et al. |

* cited by examiner

*Primary Examiner* — Ashok Patel

(57) ABSTRACT

A light source having a lead frame, a body, and a plurality of dies, each die having an LED thereon is disclosed. The body includes a top surface, a bottom surface and a plurality of side surfaces. The lead frame includes first, second, and third sections, the first section includes a die mounting area having a first protrusion that passes through the body and terminates in a pad on the bottom surface. The second and third sections each include a protrusion that is bent to form first and second leads that run along one of the side surfaces. Each die is bonded to the die mounting area such that a first contact is electrically connected to the die mounting area, and a second contact is connected to one of the second and third sections. The first protrusion of the first section provides improved heat transfer.

10 Claims, 3 Drawing Sheets

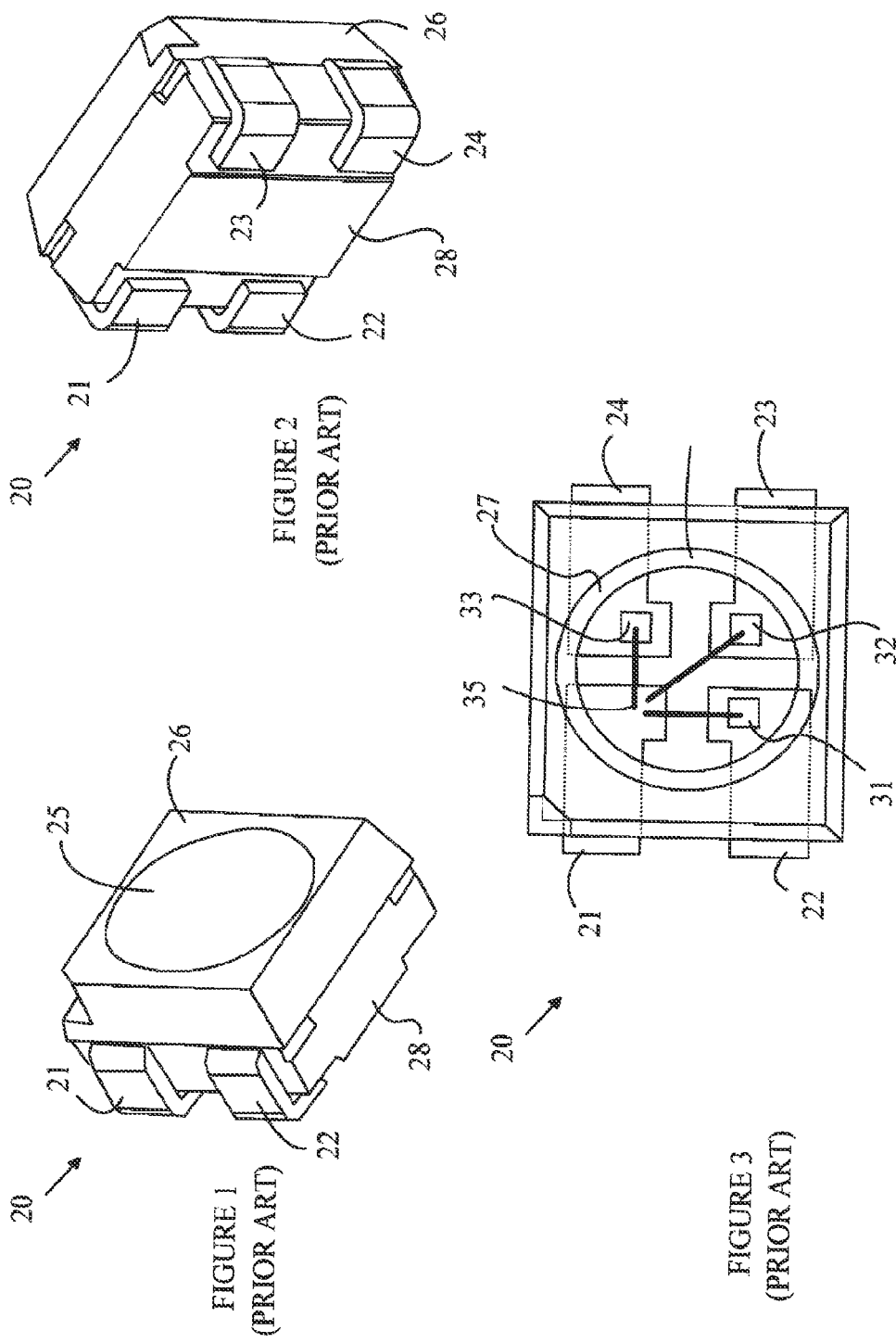

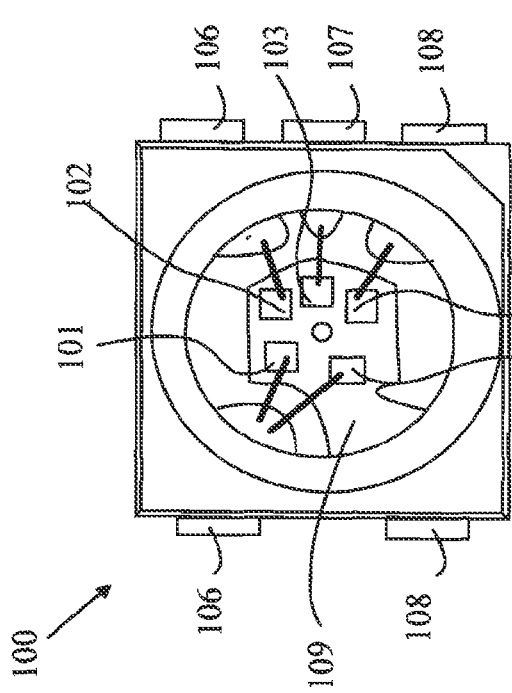
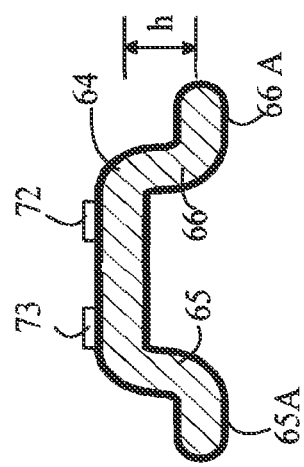
FIGURE 9
FIGURE 8
FIGURE 7

MULTI-CHIP PACKAGED LED LIGHT SOURCE

CROSS-REFERENCE TO RELATED APPLICATIONS

This application is a continuation of U.S. patent application Ser. No. 11/622,753, filed Jan. 12, 2007, the entire disclosure of which is hereby incorporated herein by reference.

BACKGROUND OF THE INVENTION

Light-emitting diodes (LEDs) are attractive candidates for the replacement of conventional light sources based on incandescent and fluorescent lights. LEDs have significantly higher power efficiencies than incandescent lights and have much greater lifetimes. In addition, LEDs do not require the high voltage systems associated with fluorescent lights and can provide light sources that more nearly approximate "point sources" than fluorescent fixtures. The latter feature is particularly important for light sources that utilize collimating or other imaging optics.

LEDs emit light in a relatively narrow spectral band. Hence, to provide a light source of an arbitrary perceived color, the light from a number of LEDs must be combined in a single light fixture or some form of phosphor conversion layer must be used to convert the narrow band of light to light having the desired color. While this complicates the construction of some LED light sources, it also provides the basis for light sources having a color that can be varied by altering the ratios of the light emitted by the various colored LEDs or an intensity by varying the power to all of the LEDs. In contrast, conventional light sources based on fluorescent tubes emit light of a fixed color and intensity.

To replace conventional light sources, several LEDs are typically needed. Typically, LEDs have power dissipations that are less than a few watts. Hence, to provide a high intensity light source to replace conventional light fixtures, a relatively large number of LEDs must be used in each light source.

In addition, LEDs age with use. Typically, the light output deceases with use and, in some cases, the spectrum emitted by the LED shifts with age giving rise to color shifts. In general, LEDs that emit different colors of light have different aging characteristics, since the aging profile of an LED depends on the fabrication process and materials, as well as other factors. In a light source based on three different color LEDs, the shift in intensity and/or spectrum causes the light emitted by the source to shift in color. To correct for these problems in a packaged LED source based on multiple LED dies, access must be provided to each die or group of dies that emit the same color of light so that the current through each die or group of dies can be adjusted separately over the life of the light source.

Heat dissipation is also a significant problem in the design of high-powered LED light sources. The efficiency with which an LED converts electrical power to light decreases with the temperature of the p-n junction in the LED. The shift in efficiency can lead to color shifts in a multi-LED light source based on LEDs of different colors. Also, the lifetime of the LED also decreases if the LED is operated at a high temperature. Hence, some mechanism for efficiently removing heat from the dies must be incorporated in the LED package. In general, the package includes some thermal path that thermally connects the LED dies to a larger heat-radiating surface such as the core of a printed circuit board on which the packaged light source is mounted. Providing such a thermal path in multi-chip LED packages presents problems, since each LED is normally mounted on a separate heat conducting pad that is connected to the printed circuit board core by a path that has a relatively high thermal resistance. To reduce the thermal resistance, the size of each of the thermal conductors must be increased, which, in turn, increases the size of the packaged light source.

SUMMARY OF THE INVENTION

The present invention includes a light source having a lead frame, a body, and a plurality of dies, each die having an LED thereon. The body includes a top surface, a bottom surface and a plurality of side surfaces. The lead frame includes first, second, and third sections, the first section includes a die mounting area having a first protrusion extending therefrom that passes through the body and terminates in a pad on the bottom surface. The second and third sections each include a lateral portion and a protrusion extending from the lateral portion, the protrusion being bent to form first and second leads that run along one of the side surfaces. Each of the dies is powered by applying a potential between the first and second contacts on the die. Each die is bonded to the die mounting area such that the first contact is electrically connected to the die mounting area, the second contact being connected to one of the second and third sections. The lead frame is embedded in the body such that light from the LEDs exits the body. The first protrusion of the first section has a lower thermal resistance than that of the first or second leads. The second and third leads can also terminate in pads on the bottom surface of the body to form a surface mounting packaged light source.

BRIEF DESCRIPTION OF THE DRAWINGS

FIGS. 1 and 2 are perspective views of prior art light source 20.

FIG. 3 is a top view of prior art light source 20.

FIG. 7 is a cross-sectional view of lead frame 70 through line 7-7 shown in FIG. 4.

FIG. 8 is a cross-sectional view of a portion of a light source 90 according to another embodiment of the present invention.

FIG. 9 is a top view of another embodiment of a light source according to the present invention.

DETAILED DESCRIPTION OF THE PREFERRED EMBODIMENTS OF THE INVENTION

Figure 6:
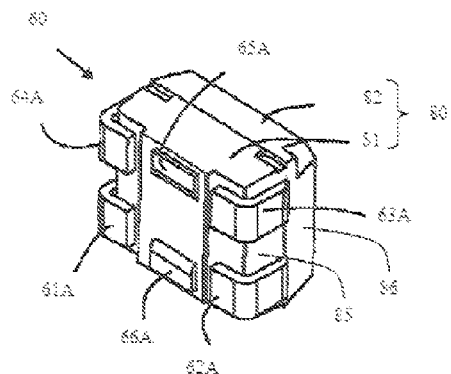
FIG. 6 is a bottom perspective view of light source 60.

The manner in which the present invention provides its advantages can be more easily understood with reference to FIGS. 1-3, which illustrate a prior art multi-LED packaged light source 20. FIGS. 1 and 2 are perspective views of light source 20, and FIG. 3 is a top view of light source 20. To simplify the drawings, the details of the die placements and connections have been omitted from FIG. 1.

Light source 20 is constructed from a lead frame that is cut to provide leads 21-24 in the finished light source. LED dies 31-33 are mounted on leads 22-24, respectively. The dies are powered by applying a potential to a first contact on the bottom of each LED and a second contact on the top of each LED. The second contacts are connected to lead 21 by wire bonds such as wire bond 35. The contacts are accessed by the portion of the leads that extend outside the package.

The package includes two parts. The lower part 28 is molded around the leads after the dies have been attached to the leads and the various wire bonds formed. The upper portion 26 includes a cavity 25 having a reflective wall 27. The upper portion is bonded to the lower portion after the lower portion is molded. The lead frame is then cut to leave the leads extending outside the package. Finally, the leads are bent to provide pads that extend under the package. These pads can be used to surface mount the packaged light source.

The heat generated by each die must be conducted away from that die by the lead on which that die is mounted. The heat is routed to the printed circuit board on which the package is mounted. The heat circuit can be viewed as consisting of a heat source, i.e., the LED, on one end of a linear heat conductor with the other end held at a constant temperature, i.e., the temperature of the core of the printed circuit board on which the package is mounted. The thermal resistance of this path depends on the length and cross-sectional dimension of the lead. For typical lead frame dimensions, this path has sufficient resistance to lead to a rise in the temperature of the LED die when a high power die is utilized.

In principle, the dimensions of the leads could be increased. Increasing the thickness of the leads results in other problems when the leads are bent around the package. Hence, any such dimensional increase must be accomplished by increasing the width of the leads outside of the package. This solution leads to an increase in the size of the package, which is also objectionable in many applications. In addition, as the number of LEDs in the package increase, the package size must increase even further.

Figure 5:
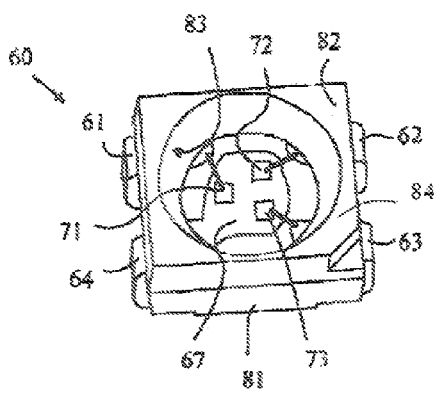
FIG. 5 is a top perspective view of light source 60.
Figure 4A:
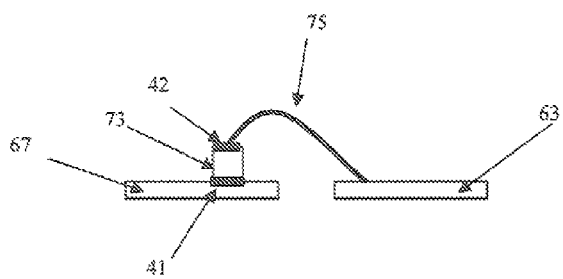
FIG. 4 is a perspective view of the lead frame used in light source 60 to provide a clearer view of the lead frame 70 in the completed light source.
Figure 4:
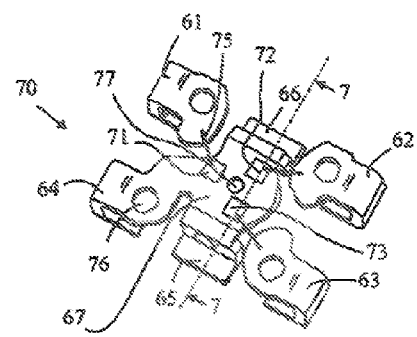

Refer now to FIGS. 4-7, which illustrate an LED light source according to one embodiment of the present invention. FIG. 4 is a perspective view of the lead frame used in light source 60 after the lead frame has been bent and with the various molded portions of light source 60 removed to provide a clearer view of the lead frame 70 in the completed light source. FIG. 5 is a top perspective view of light source 60 in which the details of the lead frame have been omitted to simplify the drawing. FIG. 6 is a bottom perspective view of light source 60.

Light source 60 has three LED dies 71-73. For the purposes of the present discussion, it will be assumed that these LEDs emit light in the red, blue, and green regions of the spectrum, respectively. However, other color combinations could be utilized depending on the particular application. The dies are mounted on a lead frame 70 that has 4 sections shown at 61-64, respectively. All of the dies are attached to a die mounting area 67 on section 64 by bonding the bottom surfaces of the die to section 64 using a conductive adhesive. Each die has first and second contacts for powering the LED, or LEDs, on the die. The first contact is assumed to be on the bottom surface of the die. Hence, all of the first contacts of the dies are connected to a common electrode that can be accessed through the external pads 64A, 65A or 66A on the bottom surface of the completed light source. The second contacts of dies 71-73 are on the top surface of the dies, and are connected to sections 61-63, respectively, of lead frame 70 by wire bonds such as wire bond 75. These contacts are accessible via pads 61A-63A on the bottom surface of light source 60 as shown in FIG. 6.

Section 64 of lead frame 70 can be viewed as having 4 sub-sections. The first sub-section is die mounting area 67. The second sub-section is a protrusion that is bent to form a lead that terminates in pad 64A after wrapping around the outside of the package. The third and fourth sub-sections shown at 65 and 66 are protrusions that are bent directly downward from die mounting area 67 and terminate in pads 65A and 66A, respectively. Sub-sections 65 and 66 form two heat paths that directly connect the die mounting area 67 to the bottom surface of light source 60. These heat paths are substantially shorter than the heat path that connects die mounting area 67 to the bottom surface of light source 60 through pad 64A since that heat path must traverse the outside surface of light source 60. Refer now to FIG. 7, which is a cross-sectional view of lead frame 70 through line 7-7 shown in FIG. 4. As can be seen from FIG. 7, the minimum length, h, of the heat conducting path from die mounting area 67 to the surface of pads 65A and 66A is determined by the parameters of the bending equipment that bend the lead frame leads and the minimum amount of encapsulant that must be provided under the die mounting area to provide adequate bonding of the lead frame in the final encapsulated product. In contrast, the length of the heat paths through a conventional package is determined by the lateral dimensions of the package as well as h. In addition, the cross-sectional area of the heat paths 65 and 66 can be significantly larger than that of sections 61-64, since these heat paths can occupy more than half of the lateral dimension of the package without interfering with the signal leads in sections 61-64. Accordingly, the present invention provides significantly better heat conduction than that obtained using a conventional multi-die package.

Refer again to FIGS. 4-6. Lead frame 70 is encapsulated in a package that can be viewed as having a bottom section 81 and a top section 82. Top section 82 includes an opening extending from the top surface of section 82 to die mounting area 67. In one embodiment, the wall 83 of this opening has slanted sides and is coated with a reflective material. Many LED dies emit a significant fraction of the light from the side walls of the dies. This light is light that was trapped within the LED due to the large difference in index of refraction of the layers used to construct the LED and the material outside the LED. To improve the efficiency of the light source, this light is re-directed into the forward region by reflecting wall 83.

The opening in top section 82 can be filled with a layer of transparent material such that the LED dies are encapsulated between the lead frame and the layer of material. This material can include a diffusing material such as scattering particles that mix the light from various LED dies to provide a light source that appears to have the dimensions of the opening and is uniform in intensity. The encapsulating material can be an epoxy, other polymer, or silicone. Diffusing materials, consisting of particles of $TiO_2$ or $SiO_2$ having dimensions of the order of wavelength of the light generated by the LEDs, could be utilized. In addition, the encapsulating material could include phosphors or luminescent materials that convert the light generated by one or more of the LEDs to light having a different spectrum. If a diffusing material is incorporated in the encapsulating layer, the walls of the opening can have a white matte finish. This finish can be applied to the walls or the material from which top section 82 is constructed could be a white polymer or similar material.

Refer now to FIG. 8, which is a cross-sectional view of a portion of a light source 90 according to another embodiment of the present invention. Light source 90 includes two LEDs 93 and 94 that are mounted on the die mounting area of the lead frame within a top section 97 having a reflector that is similar to the reflector described above. Each LED is encapsulated in a first layer of material shown at 95 and 96. This layer of material could include phosphors or other color modifying materials such as luminescent materials or dyes. The reflector is filled with a second layer of encapsulating material 91 that could also include a diffusing material as discussed above. Layer 91 could also have optical features such as lens 92 molded into the top surface of the layer.

Refer again to FIGS. 4-6. Bottom section 81 encapsulates lead frame 70. To assure that lead frame 70 is securely bound within the encapsulating material, lead frame 70 includes a number of openings such as opening 76 through which the encapsulating material flows during the molding process. An additional cutout 77 can be provided in die mounting area 67 to provide an anchor point for the encapsulating layer.

The top and bottom sections of the housing can be molded either before or after the dies have been attached to the lead frame. In the latter case, the dies would be mounted through the opening in top section 82.

The above-described embodiments of the present invention utilize three LED-containing dies. However, embodiments having different numbers of dies could also be constructed. In addition, one or more of the dies could be wired in parallel by connecting the contacts on the top surfaces of the dies to the same lead in the lead frame. Refer now to FIG. 9, which is a top view of another embodiment of a light source according to the present invention. Light source 100 includes 5 dies 101-105 that are mounted on a lead frame having a die mounting area 109 that is connected to lead 108. Dies 102-104 have the top contacts thereon connected to leads 106-108, respectively. Dies 101 and 105 have the top contacts thereon connected to lead 106. This arrangement is useful in light sources in which one of the LED colors is not available in a power rating similar to the other dies, and hence, multiple dies must be used to obtain the desired light intensity.

The above-described embodiments of the present invention utilize an arrangement in which the die mounting area is connected to a signal lead and a heat conduction pad. However, embodiments in which the direct downward heat conduction pad is also used as the signal lead for the contacts on the bottom surfaces of the dies that are mounted on the die mounting area, could also be constructed without deviating from the teachings of the present invention.

Various modifications to the present invention will become apparent to those skilled in the art from the foregoing description and accompanying drawings. Accordingly, the present invention is to be limited solely by the scope of the following claims.

What is claimed is:

1. A light source, comprising:
a bottom section having a die mounting area; and
a top section having a top surface and an opposing bottom surface, the bottom surface being interposed between the top surface and the bottom section, the top section having an opening which extends from the top surface to the bottom surface and wherein the opening is at least partially filled with both a silicone encapsulating material and a second material which comprises at least one of a phosphor and a color modifying material, wherein the second material is different from the silicone encapsulating material and physically separates at least a portion of the die mounting area from the silicone encapsulating material.

2. The light source of claim 1, further comprising one or more dies bonded to the die mounting area.

3. The light source of claim 2, wherein each of the one or more dies comprise an LED.

4. The light source of claim 3, wherein the silicone encapsulating material comprises particles having dimensions on an order of wavelength of light generated by the LED.

5. The light source of claim 3, wherein the one or more dies comprise a first die and a second die comprising a first LED and a second LED, respectively, wherein at least one of the first LED and second LED is encapsulated in the second material such that the at least one of the first LED and second LED is physically separated from the silicone encapsulating material, and wherein the silicone encapsulating material also comprises a diffusing material which mixes light from the first and second LEDs to provide a light source that appears to have dimensions of the opening and is substantially uniform in intensity.

6. The light source of claim 5, wherein at least some of the silicone encapsulating material is in direct physical contact with the die mounting area.

7. The light source of claim 1, wherein the silicone encapsulating material comprises $SiO_2$.

8. The light source of claim 1, wherein a surface of the opening comprises a non-reflective finish.

9. The light source of claim 8, wherein the non-reflective finish is constructed with a white polymer having a white matte finish.

10. The light source of claim 1, wherein an optical feature is molded into the silicone encapsulating material.

\* \* \* \* \*